US012620953B2

(12) United States Patent
Kuo et al.

(10) Patent No.: US 12,620,953 B2
(45) Date of Patent: May 5, 2026

(54) GAIN CONTROL DEVICE, METHOD AND DATA AMPLIFICATION DEVICE USING THE SAME

(71) Applicant: NUVOTON TECHNOLOGY CORPORATION, Hsinchu City (TW)

(72) Inventors: Fan Chun Kuo, Hsinchu City (TW); Ying Chuan Peng, Hsinchu City (TW)

(73) Assignee: NUVOTON TECHNOLOGY CORPORATION, Hsinchu City (TW)

( * ) Notice: Subject to any disclaimer, the term of this patent is extended or adjusted under 35 U.S.C. 154(b) by 509 days.

(21) Appl. No.: 18/447,798

(22) Filed: Aug. 10, 2023

(65) Prior Publication Data

US 2024/0136992 A1    Apr. 25, 2024
US 2024/0235508 A9    Jul. 11, 2024

(30) Foreign Application Priority Data

Oct. 24, 2022    (TW)  .................................. 111140323

(51) Int. Cl.
   *H03G 3/30*         (2006.01)
   *H03F 3/04*         (2006.01)
(52) U.S. Cl.
   CPC  .................. *H03G 3/30* (2013.01); *H03F 3/04* (2013.01); *H03G 2201/103* (2013.01)
(58) Field of Classification Search
   CPC ....... H03G 3/30; H03G 2201/103; H03F 3/04
   See application file for complete search history.

(56) References Cited

U.S. PATENT DOCUMENTS

| | | | | |
|---|---|---|---|---|
| 3,678,504 A | * | 7/1972 | Kaneko ................... | H03M 1/76 |
| | | | | 341/138 |
| 7,986,932 B1 | * | 7/2011 | Zhang .................... | H03H 17/06 |
| | | | | 455/340 |
| 2002/0027963 A1 | * | 3/2002 | Imanaka ................. | H03L 7/091 |
| | | | | 375/346 |
| 2004/0199271 A1 | * | 10/2004 | Saito ........................ | H03G 3/30 |
| 2016/0156362 A1 | * | 6/2016 | Kim ........................ | H03L 7/085 |
| | | | | 327/159 |
| 2019/0305851 A1 | * | 10/2019 | Vegas-Olmos ...... | H04B 10/541 |
| 2020/0021371 A1 | * | 1/2020 | Laugeois ................. | H03G 3/30 |

* cited by examiner

*Primary Examiner* — Janice N Tieu
(74) *Attorney, Agent, or Firm* — MUNCY, GEISSLER, OLDS & LOWE, P.C.

(57) ABSTRACT

A gain control device comprises a sign bit identification device and a gain determination device. The sign bit identification device is used to receive a data, identify a sign bit, and obtain a position of a time slot corresponding to the sign bit. Also, the data comprises a plurality of bits, wherein the most significant bit of the bits is designed to be a sign bit which is used to represent a positive or negative value of the data. The gain determination device is electrically connected to the sign bit identification device, and the gain determination device is used to determine a gain value for amplifying the data based on the position of the time slot corresponding to the sign bit identified through the sign bit identification device.

13 Claims, 4 Drawing Sheets

S300    The input data is received

S320    The position of the time slot corresponding to the most significant bit used to represent the sign bit in the input data is identified.

S340    The gain value of the amplifier is determined based on the position of the time slot.

GAIN CONTROL DEVICE, METHOD AND DATA AMPLIFICATION DEVICE USING THE SAME

CROSS-REFERENCE TO RELATED APPLICATION

This application claims the priority from the TW Patent Application No. 111140323, filed on Oct. 24, 2022 and all contents of such TW Patent Application are comprised in the present disclosure.

BACKGROUND

1. Field of the Invention

The present disclosure relates to a gain control device, a method and a data amplification device using the same, in particular to, a gain control device, a method and a data amplification device using the same that does not use the Inter-Integrated Circuit (I2C) bus and the Serial Peripheral Interface (SPI) bus, and can determine the gain value based on a position of the corresponding time slot of the most significant bit (MSB) used to represent a positive or negative value.

2. Description of the Related Art

After various types of integrated circuits receive data, they may need to amplify with a gain value greater than one because the signal value of the data is weak. When the integrated circuit is provided with a communication interface, such as an Inter-Integrated Circuit bus or a Serial Peripheral Interface bus, etc., the gain control command can be transmitted to the integrated circuit via the Inter-Integrated Circuit bus or the Serial Peripheral Interface bus so that the integrated circuit adjusts the gain value.

However, under cost considerations, not all integrated circuits are provided with the communication interface, such as the Inter-Integrated Circuit bus or the Serial Peripheral Interface bus, etc. For the integrated circuits without the communication interface, such as the Inter-Integrated Circuit bus or the Serial Peripheral Interface bus, the integrated circuits are necessary to assign an additional specific pin when the integrated circuits still need to perform gain control. Moreover, a gain value of the integrated circuit is determined and controlled via the voltage applied to the specific pin. However, the manner of determining the gain value via the voltage applied to the specific pin is likely to cause the output gain unstable when the voltage of the specific pin is disturbed and unsteady.

SUMMARY

In view of the problems in the related art, purposes of the present disclosure are to provide a gain control device, a method and a data amplification device using the same. The gain control device, the method and the data amplification device using the same can effectively control the gain value of the integrated circuit without an Inter-Integrated Circuit bus, a Serial Peripheral Interface bus or a specific pin.

Based on one of the purposes of the present disclosure, the present disclosure provides a gain control device. The gain control device comprises a sign bit identification device and a gain determination device. The sign bit identification device is configured to receive a data, identify a sign bit, and obtain a position of a time slot corresponding to the sign bit.

Besides, the data comprises a plurality of bits, and the most significant bit of the bits is designed to be the sign bit used to represent a positive or negative value of the data. The gain determination device is electrically connected to the sign bit identification device. The gain determination device is configured to determine a gain value for amplifying the data based on the position of the time slot corresponding to the sign bit identified by the sign bit identification device.

Based on one of the purposes of the present disclosure, the present disclosure further provides a data amplification device. The data amplification device comprises a plurality of channel amplification modules. Also, each of the channel amplification modules comprises the mentioned gain control device and an amplifier. The amplifier is electrically connected to the gain control device, and the amplifier is configured to amplify the data based on the gain value determined by the gain control device.

Based on one of the purposes of the present disclosure, the present disclosure further provides a gain control method. The gain control method comprises the following steps. A data is received. Besides, the data comprises a plurality of bits, and the most significant bit of the bits is designed to be the sign bit used to represent a positive or negative value of the data. Then, the sign bit is identified, and the position of the time slot corresponding to the sign bit is obtained. A gain value is determined for amplifying the data based on the position of the time slot corresponding to the identified sign bit.

To sum up, the gain control device, the method and the data amplification device using the same provided by embodiments of the present disclosure have following advantages. The embodiments of the present disclosure save cost and have better performance. Also, the embodiments of the present disclosure do not require complex circuits and calculations, so that the embodiments of the present disclosure have low design complexity. Therefore, it is easy to achieve mass production.

To further understand the technology, means, and effects of the present disclosure, reference may be made by the detailed description and drawing as follows. Accordingly, the purposes, features and concepts of the present disclosure can be thoroughly and concretely understood. However, the following detailed description and drawings are only used to reference and illustrate the implementation of the present disclosure, and they are not used to limit the present disclosure.

BRIEF DESCRIPTION OF THE DRAWINGS

The accompanying drawings are provided to enable persons with ordinary knowledge in the technical field of the present disclosure to further understand the present disclosure, and are incorporated into and constitute a part of the specification of the present disclosure. The drawings illustrate exemplary embodiments of the present disclosure, and are used to explain the principle of the present disclosure together with the description of the present disclosure.

3

Figure 1A:
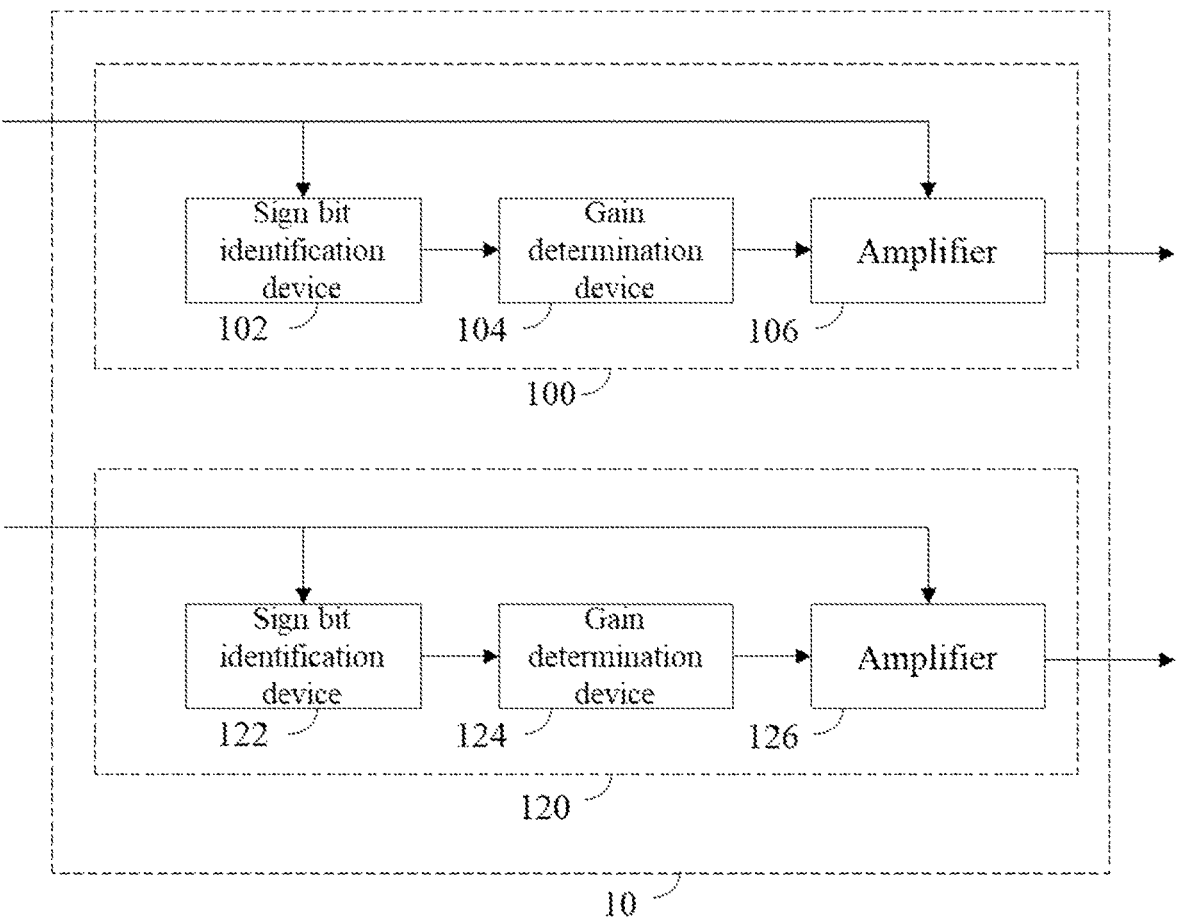
FIG. 1A is a schematic diagram of a data amplification device according to an embodiment of the present disclosure.
Figure 1B:
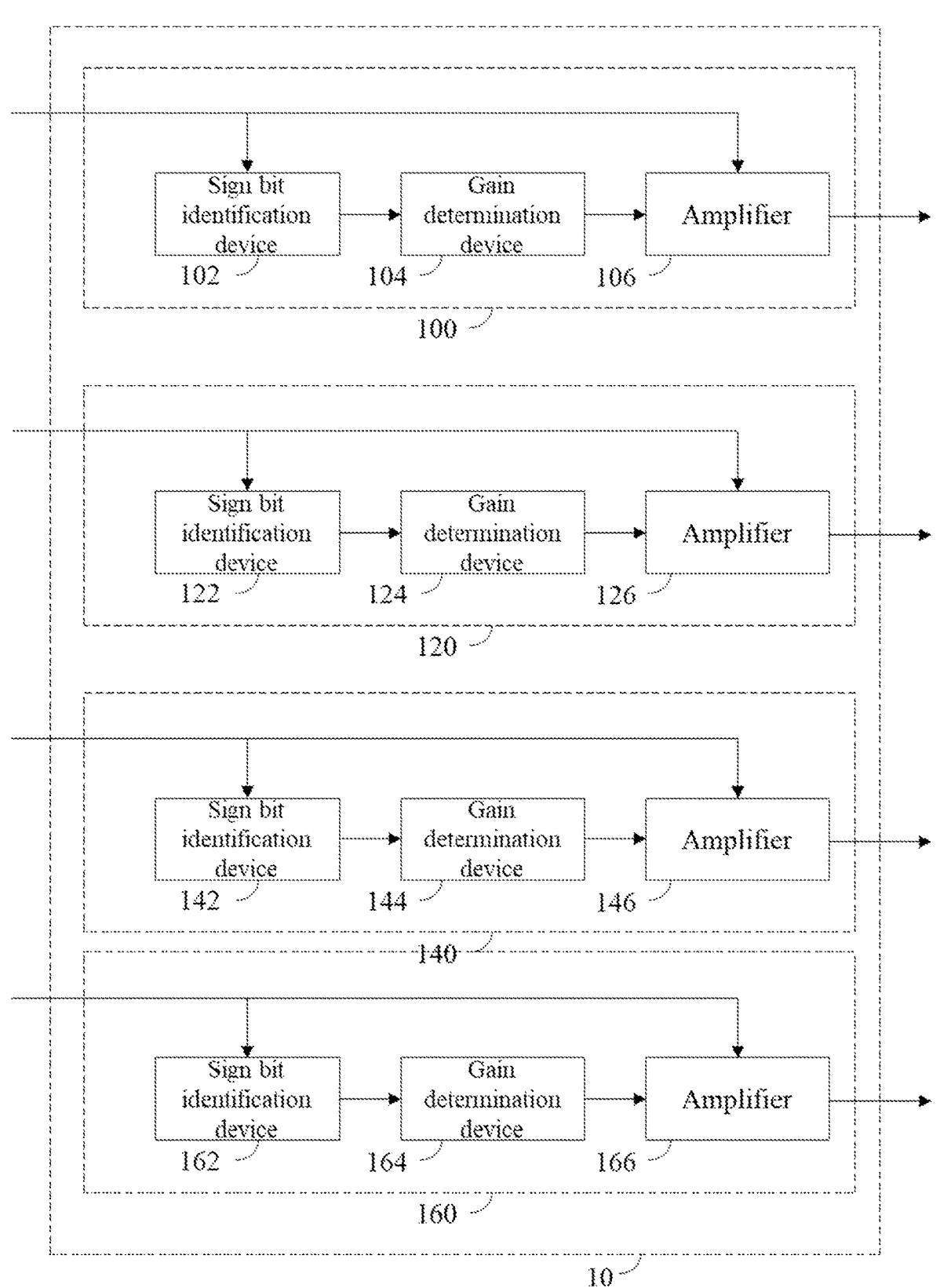
FIG. 1B is a schematic diagram of a data amplification device according to another embodiment of the present disclosure.
Figure 2A:
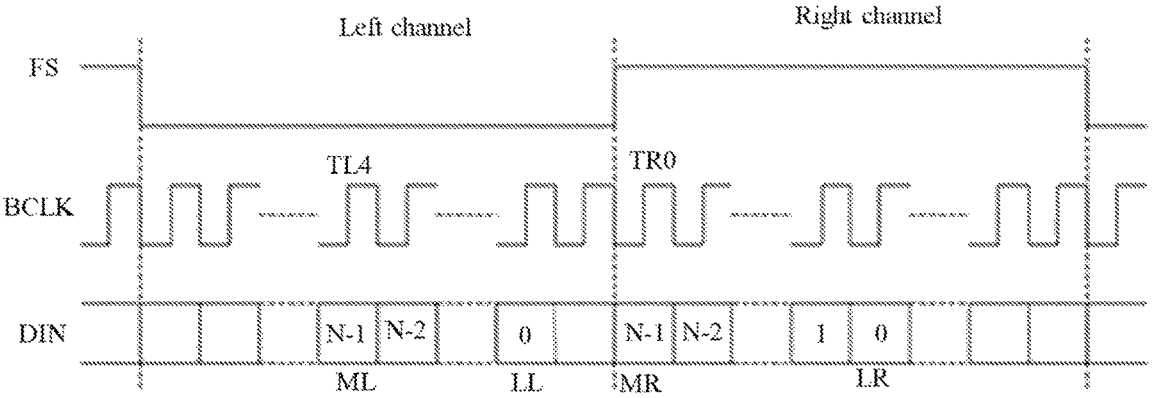
FIG. 2A is a schematic diagram of an input data, a clock signal and a channel selection signal of the data amplification device in FIG. 1A.
Figure 2B:
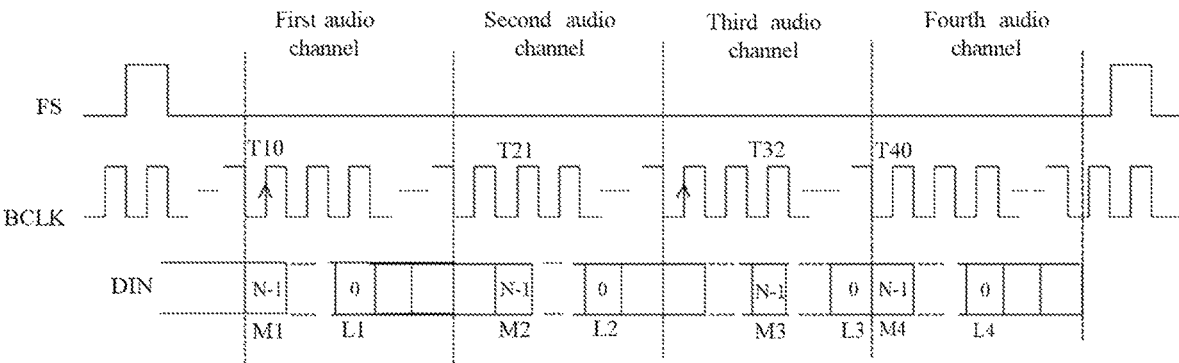

FIG. 2B is a schematic diagram of an input data, a clock signal and a channel selection signal of the data amplification device in FIG. 1B.

Figure 3:
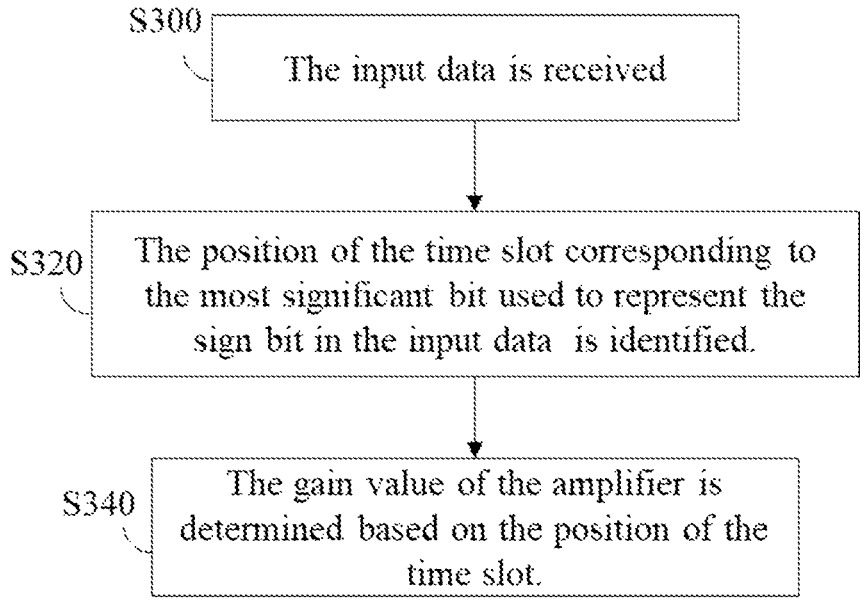

FIG. 3 is a flowchart of a gain control method according to an embodiment of the present disclosure.

DESCRIPTION OF THE PREFERRED EMBODIMENTS

Now, reference will be made in detail to exemplary embodiments of the present disclosure, exemplary embodiments of which are illustrated in the accompanying drawings. In the case of possibility, the same reference numbers will be used in the drawings and the description to refer the same or similar parts. In addition, the practice of the exemplary embodiments is only one implementation of the design concept of the present disclosure, and the following exemplary embodiments are not intended to limit the present disclosure.

In order to avoid generating the technical problems mentioned in the related art, the present disclosure provides a gain control device. The gain control device does not need the Inter-Integrated Circuit bus and the Serial Peripheral Interface bus. Also, the gain control device does not need to be provided with an additional specific pin. Therefore, it avoids the situation that the gain value becomes unstable due to interference. Further, the gain control device of the present disclosure mainly detects the position of the time slot corresponding to the most significant bit used to represent a positive or negative value, that is, a sign bit in the input data, and the gain control device of the present disclosure determines a gain value based on the position of the corresponding time slot.

Since the position of the time slot corresponding to the sign bit is detected, the technical problem in the related art that the voltage of the specific pin is interfered or unsteady so that the gain value becomes unstable does not occur. Thus, the gain control device of the embodiments of the present disclosure has the advantages of better performance and no need for an additional specific pin. On the other hand, the embodiments of the present disclosure also provide a gain control method corresponding to the gain control device and a data amplification device using the mentioned gain control device. Moreover, the data amplification device is especially an audio data amplification device.

Furthermore, the gain control device can determine the position of which rising edge or falling edge of a clock signal corresponding to the sign bit of the data from the host when the most significant bit of the adopted data is designed as the sign bit. As well, the gain control device determines a gain value for amplifying the data based on the determined position. That is, the gain value is changed by changing the position of the sign bit in the time slot. In this way, the data amplification device using the gain control device does not need the Inter-Integrated Circuit bus and the Serial Peripheral Interface bus. Also, the data amplification device does not need the additional specific pin.

In addition, the width of the time slot can be determined via the Inter-Integrated Circuit bus and the Serial Peripheral Interface bus when the input data is an Integrated Interchip Sound (I2S) data or a Pulse Coding Modulation Time Division Multiplexing (PCM TDM) audio data. However, since the data amplification device does not be provided with the Inter-Integrated Circuit bus and the Serial Peripheral Interface bus, the width of each time slot is constant for the data amplification device and the gain control device. In this way, the gain control device can detect the position of the sign bit in the time slot, that is, which time slots, or which rising edge or which falling edge of the clock signal so that the gain control device determines the gain value based on the position of the sign bit in the time slot.

Firstly, please refer to FIG. 1A, FIG. 1A is a schematic diagram of a data amplification device according to an embodiment of the present disclosure. A data amplification device 10 may be, for example, an audio data amplification device, but the present disclosure is not limited thereto. The data amplification device 10 comprises a plurality of channel amplification modules 100 and 120. In this embodiment, the channel amplification modules 100 and 120 may be a left channel amplification module and a right channel amplification module, and the input data is the Integrated Interchip Sound data. The channel amplification module 100 comprises the sign bit identification device 102, the gain determination device 104 and the amplifier 106. The channel amplification module 120 comprises the sign bit identification device 122, the gain determination device 124 and the amplifier 126. The sign bit identification device 102 is electrically connected to the gain determination device 104, and the sign bit identification device 122 is electrically connected to the gain determination device 124. The gain determination device 104 is electrically connected to the amplifier 106, and the gain determination device 124 is electrically connected to the amplifier 126. The amplifiers 106 and 126 may be electrically connected to external speakers, loudspeakers or earphones, etc.

The sign bit identification devices 102 and 122 are configured to receive the data of the left channel and the right channel of the input data. It is noted that the input data may comprise the data of the left channel and the right channel. Also, the sign bit identification devices 102 and 122 are configured to identify the sign bits the data of the left channel and the right channel of the input data. The data of the left channel and the right channel respectively comprise a plurality of bits, and the most significant bit of the bits of the data of the left channel and the right channel is designed to be the sign bit for representing the positive or negative value of the data. The gain determination device 104 is configured to determine the gain value for amplifying the data based on the position of the time slot corresponding to the sign bit of the data of the left channel identified by the sign bit identification device 102. As well, the gain determination device 124 is used to determine the gain value for amplifying the data based on the position of the time slot corresponding to the sign bit of the data of the right channel identified by the sign bit identification device 122. Then, the amplifiers 106 and 126 are used to amplify the data of the left channel and the right channel based on the gain values determined by the gain determination devices 104 and 124 respectively.

Please refer to FIG. 1A and FIG. 2A at the same time, FIG. 2A is a schematic diagram of an input data, a clock signal and a channel selection signal of the data amplification device in FIG. 1A. In this embodiment, the input data is the Integrated Interchip Sound data, and the input data comprises the data of the left channel and the right channel. In FIG. 2A, the channel selection signal FS is used to represent that the current input data DIN is the data of the left channel or the data of the right channel. For example, when the channel selection signal FS is logic low, it means that the input data DIN is the data of the left channel. Accordingly, the channel amplification module 100 is used to process the input data DIN and determine the gain value. Similarly, when the channel selection signal FS is logic high, it means that the input data is the data of the right channel. Accordingly, the channel amplification module 120 is used to process the input data DIN and determine the gain value. In FIG. 2A, the data of the left channel comprises the plurality of bits from the most significant bit ML to the least significant bit LL. Besides, the marked N−1, N-2, . . . , 1, 0 represent the index value of the bit respectively. Similarly, the data of the right channel comprises the plurality of bits from the most significant bit MR to the least significant bit LR.

In FIG. 2A, when the channel selection signal FS is represented as the left channel, the sign bit identification device 102 is used to count the rising edge of the clock signal BCLK corresponding to the data of the left channel to generate a count value. It is noted that the rising edge may be substituted for the falling edge in other embodiments. As well, the sign bit identification device 102 obtains the position of the time slot corresponding to the sign bit based on the count value when identifying the sign bit, that is, the most significant bit ML. In this embodiment, the most significant bit ML appears in the time slot TL4. Also, the position of the time slot TL4 corresponds to the fifth rising edge of the clock signal BCLK when the channel selection signal FS represents the left channel. The gain determination device 104 determines the gain value of the amplifier 106 as the gain value corresponding to the position of the time slot TL4, that is, the position of the fifth time slot.

In FIG. 2A, when the channel selection signal FS is represented as the right channel, the sign bit identification device 122 is used to count the rising edge of the clock signal BCLK corresponding to the data of the right channel to generate a count value. It is noted that the rising edge may be substituted for the falling edge in other embodiments. As well, the sign bit identification device 122 obtains the position of the time slot corresponding to the sign bit based on the count value when identifying the sign bit, that is, the most significant bit MR. In this embodiment, the most significant bit MR appears in the time slot TRO. Also, the position of the time slot TRO corresponds to the first rising edge of the clock signal BCLK when the channel selection signal FS is represented as the right channel. Thus, the gain determination device 124 determines the gain value of the amplifier 126 as the gain value corresponding to the position of the time slot TRO, that is, the position of the first time slot.

Please also refer to FIG. 1B, FIG. 1B is a schematic diagram of a data amplification device according to another embodiment of the present disclosure. In FIG. 1B, the input data DIN is the Pulse Coding Modulation Time Division Multiplexing audio data. Comparing with FIG. 1A, the data amplification device 10 in FIG. 1B further comprises the plurality of channel amplification modules 140 and 160. In this embodiment, the channel amplification module 100 represents the first audio channel amplification module, the channel amplification module 120 represents the second audio channel amplification module, the channel amplification module 140 represents the third audio channel amplification module, and the channel amplification module 160 represents the fourth audio channel amplification module, but the present disclosure is not limited thereto. The sign bit identification devices 142 and 162 are similar to the sign bit identification devices 102 and 122, the gain determination devices 144 and 164 are similar to the gain determination devices 104 and 124, and the amplifiers 146 and 166 are similar to the amplifiers 106 and 126, so they will not be described here. In other embodiments, the channel amplification modules may also be the first to the $N^{th}$ channel amplification modules. In addition, the number of the N is greater than or equal to 2, and the present disclosure is not limited thereto.

Please refer to FIG. 1B and FIG. 2B, FIG. 2B is a schematic diagram of an input data, a clock signal and a channel selection signal of the data amplification device in FIG. 1B. The channel selection signal FS between two logic high levels is divided into four periods to represent that the current input data DIN is the data of from the first to the fourth audio channels respectively. In FIG. 2B, the data of the first audio channel comprises the plurality of bits from the most significant bit M1 to the least significant bit L1. Besides, the marked N−1, N-2, . . . , 1, 0 respectively represent the index value of the bit. Similarly, the data of the second audio channel comprises the plurality of bits from the most significant bit M2 to the least significant bit L2, the data of the third audio channel comprises the plurality of bits from the most significant bit M3 to the least significant bit L3, and the data of the fourth audio channel comprises the plurality of bits from the most significant bit M4 to the least significant bit L4.

In FIG. 2B, the sign bit identification device 102 determines that the most significant bit M1 of the data of the first audio channel appears in the time slot T10. Also, the position of the time slot T10 corresponds to the first rising edge of the clock signal BCLK when the channel selection signal FS represents the first audio channel. Then, the gain determination device 104 determines the gain value of the amplifier 106 as the gain value corresponding to the position of the time slot T10, that is, the position of the first time slot. The sign bit identification device 122 determines that the most significant bit M2 of the data of the second audio channel appears in the time slot T21. Also, the position of the time slot T21 corresponds to the second rising edge of the clock signal BCLK when the channel selection signal FS represents the second audio channel. Then, the gain determination device 124 determines the gain value of the amplifier 126 as the gain value corresponding to the position of the time slot T21, that is, the position of the second time slot. The sign bit identification device 142 determines that the most significant bit M3 of the data of the third audio channel appears in the time slot T32. Also, the position of the time slot T32 corresponds to the third rising edge of the clock signal BCLK when the channel selection signal FS represents the third audio channel. Then, the gain determination device 144 determines the gain value of the amplifier 146 as the gain value corresponding to the position of the time slot T32, that is, the position of the third time slot. The sign bit identification device 162 determines that the most significant bit M4 of the data of the fourth audio channel appears in the time slot T40. Also, the position of the time slot T40 corresponds to the first rising edge of the clock signal BCLK when the channel selection signal FS represents the fourth audio channel. Then, the gain determination device 164 determines the gain value of the amplifier 166 as the gain value corresponding to the position of the time slot T40, that is, the position of the first time slot.

Finally, please refer to FIG. 3, FIG. 3 is a flowchart of a gain control method according to an embodiment of the present disclosure. Firstly, in step S300, the data is received. Besides, the data comprises the plurality of the bits, and the most significant bit of the bits is designed to be the sign bit used to represent positive or negative value of the data. Then, in step S320, the sign bit is identified. Also, the position of the time slot corresponding to the sign bit is obtained. Finally, in the step S340, the gain value for amplifier to amplify the data is determined based on the position of the time slot corresponding to the identified sign bit.

As stated as above, the gain control device, the method and the data amplification device using the same provided by the embodiments of the present disclosure have the following advantages. Firstly, the gain value can be controlled without the Inter-Integrated Circuit bus, the Serial Peripheral Interface bus or an additional specific pin. Secondly, the position of the time slot of the sign bit, that is, the rising edge or the falling edge of the clock signal where the sign bit appears is used to determine the gain value for amplifying when the time slot at the receiving end, that is, the gain control device or the data amplification device is constant. Thirdly, the present disclosure can solve the technical problem in the related art that the amplified gain value changes instantaneously due to unstable voltage when the gain value is determined via the voltage of the specific pin. Fourthly, the cost required for configuring the additional specific pin is saved.

It should be understood that the examples and embodiments described herein are for illustrative purpose only, and various modifications or changes in view thereof will be suggested to those skilled in the art, and will be comprised in the spirit and scope of the application and the appended within the scope of the claims.

What is claimed is:

1. A gain control device, comprising:
a sign bit identification device, configured to receive a data, identify a sign bit, and obtain a position of a time slot corresponding to the sign bit,
wherein the data comprises a plurality of bits, and
wherein a most significant bit of the plurality of bits is designed to be the sign bit used to represent a positive or negative value of the data; and
a gain determination device, electrically connected to the sign bit identification device, and configured to determine a gain value for amplifying the data based on the position of the time slot corresponding to the sign bit identified by the sign bit identification device.

2. The gain control device according to claim 1, wherein the gain control device does not comprise an Inter-Integrated Circuit bus or a Serial Peripheral Interface bus.

3. The gain control device according to claim 1, wherein the sign bit identification device is configured to count a rising edge or a falling edge of a clock signal corresponding to the data to generate a count value, and
the sign bit identification device obtains the position of the time slot corresponding to the sign bit based on the count value when the sign bit identification device identifies the sign bit.

4. The gain control device according to claim 1, wherein the data is an Integrated Interchip Sound data or a Pulse Coding Modulation Time Division Multiplexing audio data.

5. A data amplification device, comprising:
a plurality of channel amplification modules, wherein each of the plurality of channel amplification modules comprises:
a gain control device, comprising:
a sign bit identification device, configured to receive a data, identify a sign bit, and obtain a position of a time slot corresponding to the sign bit, wherein the data comprises a plurality of bits, and wherein a most significant bit of the plurality of bits is designed to be the sign bit used to represent a positive or negative value of the data; and
a gain determination device, electrically connected to the sign bit identification device, and configured to determine a gain value for amplifying the data based on the position of the time slot corresponding to the sign bit identified by the sign bit identification device, and
an amplifier, electrically connected to the gain control device, and configured to amplify the data based on the gain value determined by the gain control device.

6. The data amplification device according to claim 5, wherein the gain control device does not comprise an Inter-Integrated Circuit bus and a Serial Peripheral Interface bus.

7. The data amplification device according to claim 5, wherein the sign bit identification device is configured to count a rising edge or a falling edge of a clock signal corresponding to the data to generate a count value, and
the sign bit identification device obtains the position of the time slot corresponding to the sign bit based on the count value when the sign bit identification device identifies the sign bit.

8. The data amplification device according to claim 5, wherein the data is an Integrated Interchip Sound data or a Pulse Coding Modulation Time Division Multiplexing audio data.

9. The data amplification device according to claim 5, wherein the plurality of the channel amplification modules comprise a left channel amplification module and a right channel amplification module, or
the plurality of the channel amplification modules comprise a first audio channel amplification module to an $N^{th}$ channel amplification module, wherein a number of N is a positive integer greater than or equal to 2.

10. A gain control method, comprising:
receiving a data, wherein the data comprises a plurality of bits, and a most significant bit of the plurality of bits is designed to be a sign bit used to represent a positive or negative value of the data;
identifying the sign bit, and obtaining a position of a time slot corresponding to the sign bit; and
determining a gain value for amplifying the data based on the position of the time slot corresponding to the identified sign bit.

11. The gain control method according to claim 10, wherein the gain control method is implemented on a gain control device does not comprise an Inter-Integrated Circuit bus and a Serial Peripheral Interface bus.

12. The gain control method according to claim 10, wherein a count value is generated by counting a rising edge or a falling edge of a clock signal corresponding to the data, wherein the position of the time slot corresponding to the sign bit is obtained based on the count value when identifying the sign bit.

13. The gain control method according to claim 10, wherein the data is an Integrated Interchip Sound data or a Pulse Coding Modulation Time Division Multiplexing audio data.

* * * * *